US010109981B2

(12) United States Patent
Sysak et al.

(10) Patent No.: US 10,109,981 B2
(45) Date of Patent: Oct. 23, 2018

(54) ASYMMETRIC OPTICAL WAVEGUIDE GRATING RESONATORS AND DBR LASERS

(71) Applicant: Intel Corporation, Santa Clara, CA (US)

(72) Inventors: Matthew Sysak, Santa Barbara, CA (US); Jock Bovington, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/039,837

(22) PCT Filed: Dec. 27, 2013

(86) PCT No.: PCT/US2013/077995
§ 371 (c)(1),
(2) Date: May 26, 2016

(87) PCT Pub. No.: WO2015/099764
PCT Pub. Date: Jul. 2, 2015

(65) Prior Publication Data
US 2016/0380407 A1    Dec. 29, 2016

(51) Int. Cl.
*H04B 10/06* (2006.01)
*H01S 5/12* (2006.01)
(Continued)

(52) U.S. Cl.
CPC ............ *H01S 5/1228* (2013.01); *G02B 6/124* (2013.01); *G02B 6/1228* (2013.01);
(Continued)

(58) Field of Classification Search
CPC ...... H01S 5/1228; H01S 5/021; H01S 5/0654; H01S 5/1206; H01S 5/1231;
(Continued)

(56) References Cited

U.S. PATENT DOCUMENTS

| 4,834,483 A * | 5/1989 | Arthurs .............. H04Q 11/0001 385/46 |
| 6,577,660 B1 | 6/2003 | Yoshiharu |

(Continued)

FOREIGN PATENT DOCUMENTS

| JP | S63-166281 | 7/1988 |
| JP | H3-40481 | 2/1991 |

(Continued)

OTHER PUBLICATIONS

Kwon, et al. "Effects of Asymmetric Grating Structures on Output Efficiency and Single Longitudinal Mode Operation in λ/4-Shifted DFB Laser", IEEE Journal of Quantum Electronics, vol. 47, No. 9, Sep. 2011, 10 pages.

(Continued)

*Primary Examiner* — M. R. Sedighian
(74) *Attorney, Agent, or Firm* — Green, Howard & Mughal LLP

(57) ABSTRACT

Monolithic asymmetric optical waveguide grating resonators including an asymmetric resonant grating are disposed in a waveguide. A first grating strength is provided along a first grating length, and a second grating strength, higher than the first grating strength, is provided along a second grating length. In advantageous embodiments, the effective refractive index along first grating length is substantially matched to the effective refractive index along second grating length through proper design of waveguide and grating parameters. A well-matched effective index of refraction may permit the resonant grating to operate in a highly asymmetric single longitudinal mode (SLM). In further embodiments, an asymmetric monolithic DFB laser diode includes front and back grating sections having waveguide and grating parameters for highly asymmetric operation.

19 Claims, 7 Drawing Sheets

(51) Int. Cl.
| | |
|---|---|
| *G02B 6/122* | (2006.01) |
| *G02B 6/124* | (2006.01) |
| *H01S 5/065* | (2006.01) |
| *H01S 5/30* | (2006.01) |
| *H04B 10/66* | (2013.01) |
| *H04B 10/80* | (2013.01) |
| *H01S 5/10* | (2006.01) |
| *H01S 5/02* | (2006.01) |
| *H01S 5/22* | (2006.01) |

(52) U.S. Cl.
CPC .......... *H01S 5/0654* (2013.01); *H01S 5/1014* (2013.01); *H01S 5/1032* (2013.01); *H01S 5/1206* (2013.01); *H01S 5/1237* (2013.01); *H01S 5/3013* (2013.01); *H04B 10/66* (2013.01); *H04B 10/801* (2013.01); *H01S 5/021* (2013.01); *H01S 5/1225* (2013.01); *H01S 5/1231* (2013.01); *H01S 5/22* (2013.01)

(58) Field of Classification Search
CPC .... H01S 5/3013; H01S 5/1032; H01S 5/1225; H01S 5/1014; H01S 5/1237; H01S 5/22; G02B 6/1228; G02B 6/124; H04B 10/66; H04B 10/801
USPC .......................................... 398/214
See application file for complete search history.

(56) References Cited

U.S. PATENT DOCUMENTS

| | | | |
|---|---|---|---|
| 6,638,773 B1* | 10/2003 | Hwang | H01S 5/1082 |
| | | | 438/2 |
| 7,961,765 B2 | 6/2011 | Jones | |
| 2003/0210725 A1 | 11/2003 | Prassas et al. | |
| 2005/0094924 A1 | 5/2005 | Forrest et al. | |
| 2006/0209911 A1* | 9/2006 | Takabayashi | H01S 5/06256 |
| | | | 372/20 |
| 2007/0248134 A1 | 10/2007 | Hatori | |
| 2008/0165818 A1* | 7/2008 | Hashimoto | B82Y 20/00 |
| | | | 372/43.01 |
| 2008/0193084 A1 | 8/2008 | Accard | |
| 2008/0212637 A1* | 9/2008 | Makino | B82Y 20/00 |
| | | | 372/50.11 |
| 2008/0232411 A1 | 9/2008 | Reid et al. | |
| 2009/0116522 A1 | 5/2009 | Watson et al. | |
| 2010/0246617 A1 | 9/2010 | Jones | |
| 2011/0299561 A1* | 12/2011 | Akiyama | H01S 5/02248 |
| | | | 372/50.11 |
| 2013/0182728 A1 | 7/2013 | Li | |

FOREIGN PATENT DOCUMENTS

| | | |
|---|---|---|
| JP | 200136192 | 2/2001 |
| JP | 2003218462 | 7/2003 |
| JP | 2008160130 | 7/2008 |
| JP | 2012517030 | 7/2012 |
| WO | 2010100738 | 9/2010 |

OTHER PUBLICATIONS

Liu; et al. "Designing Coupled-Resonator Optical Waveguides Based on High-Q Tapered Grating-Defect Resonators", Optics Express, vol. 20, No. 8, Apr. 9, 2012, 15 pages.
Fang, et al. "A Distributed Bragg Reflector Silicon Evanescent Laser," IEEE Photonics Technology Letters, vol. 20, No. 20, Oct. 15, 2008, 3 pages.
Fang, et al. "A Distributed Feedback Silicon Evanescent Laser," Optics Express, vol. 16, No. 7, Mar. 31, 2008, 7 pages.
International Preliminary Report on Patentability for PCT/US13/77995 dated Jul. 7, 2016, 7 pages.
International Search Report & Written Opinion for International Application No. PCT/US13/77995 dated Sep. 24, 2014, 10 pages.
Notice of Preliminary Rejection for Korean Patent Application No. 2016-7014093, dated Jun. 13, 2017.
Notification of Reasons for Refusal (Office Action) for Japanese Patent Application No. 2016-532602, dated Jun. 9, 2017.
Notice Preliminary Rejection for Korean Patent Application No. 2016-7014093, dated Dec. 27, 2017.
First Office Action for China Patent Application No. 201380081247.4, dated Jun. 4, 2018.
Notice of Final Rejection for Korean Patent Application No. 2016-7014093, dated Jul. 20, 2018.

* cited by examiner

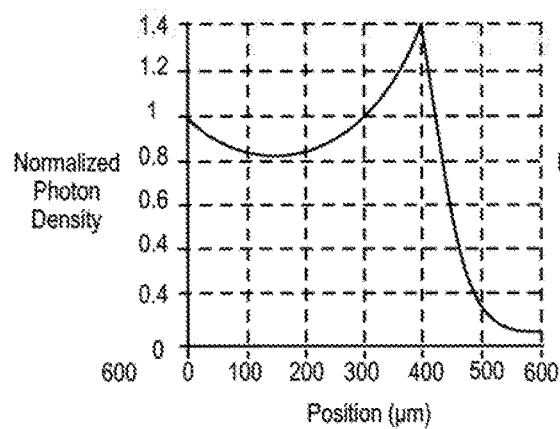 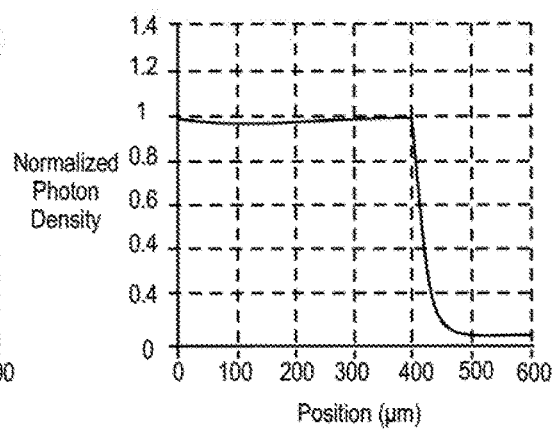
FIG. 3       FIG. 4
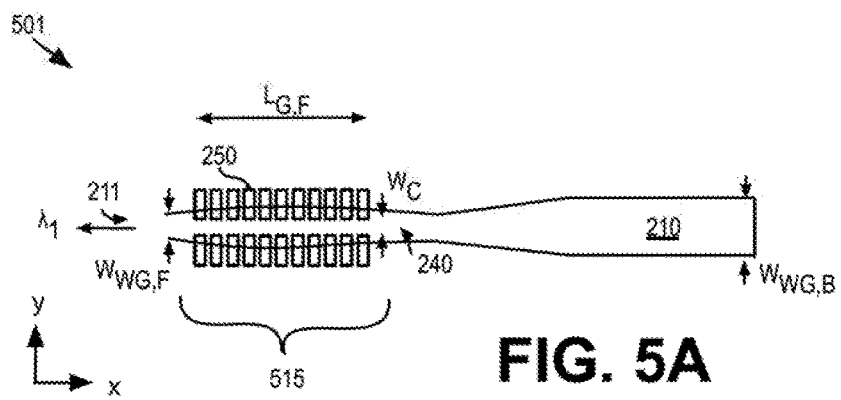
FIG. 5A
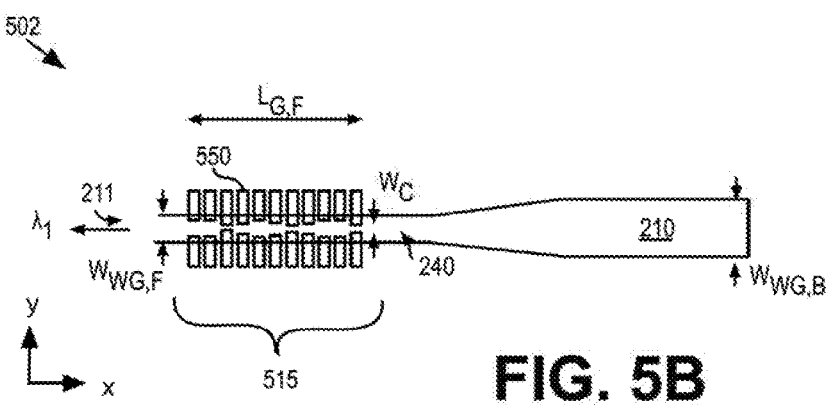
FIG. 5B

ASYMMETRIC OPTICAL WAVEGUIDE GRATING RESONATORS AND DBR LASERS

CLAIM OF PRIORITY

This application is a National Phase Application of, and claims priority to, PCT Application No. PCT/US13/77995, filed on 27 Dec. 2013, titled "ASYMMETRIC OPTICAL WAVEGUIDE GRATING RESONATORS & DBR LASERS", which is incorporated by reference in its entirety for all purposes.

TECHNICAL FIELD

Embodiments of the invention are generally related to monolithic photonic integrated circuits (PICs).

BACKGROUND

A photonic integrated circuit (PIC) includes monolithically integrated photonic devices or elements and is useful as an optical data link in applications such as optical communications and high performance computing. For mobile computing platforms too, PICs offer a promising I/O for rapidly updating or syncing a mobile device with a host device and/or cloud service. Such optical links utilize an optical I/O interface that includes an optical transmitter and/or an optical receiver including one or more optical waveguide propagating light through one or more passive or active photonic device.

PICs are preferred to optical systems built with discrete optical components due to their compact size, lower cost, and the heightened functionality and/or performance. Silicon Photonics (SiPh) technology has clear advantages in terms of manufacturability and scalability. Lasers may be included in a transmitter or transceiver PIC. For SiPh technology, a hybrid silicon laser may be utilized which includes a compound semiconductor (e.g., III-V) gain medium bonded to, or epitaxially grown on, a silicon semiconductor device layer.

DFB laser architectures typically have a symmetric output (i.e., the same amount of light comes out both ends of the laser), which is disadvantageous in most optical systems because only one end of the laser is functionally coupled to other components in the optical system. For optical systems built with discrete optical components, a high-reflection coating (e.g., metal coating) may be applied to one end of a DFB laser to avoid wasting the other portion of the laser output not coupled to the optical system. This solution is not often practical for PICs, however.

DFB laser architectures also often suffer from a phenomenon known as "spatial hole burning" (SHB), which degrades laser performance over temperature as well as output power, and/or mode stability. The SHB effect stems from a highly asymmetric photon distribution and electric field distribution.

DFB laser architectures that address these limitations while remaining manufacturable are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 3 is a graph of photon density as a function of position within an asymmetric DFB laser diode, in accordance with an embodiment lacking an apodized grating region;

FIG. 4 is a graph of photon density as a function of position within an asymmetric DFB laser diode, in accordance with an embodiment including one or more apodized grating region;

FIGS. 5A and 5B are plan views of an asymmetric DFB laser diode front waveguide grating, in accordance with exemplary apodization embodiments;

DETAILED DESCRIPTION OF EXEMPLARY EMBODIMENTS

Figure 1A:
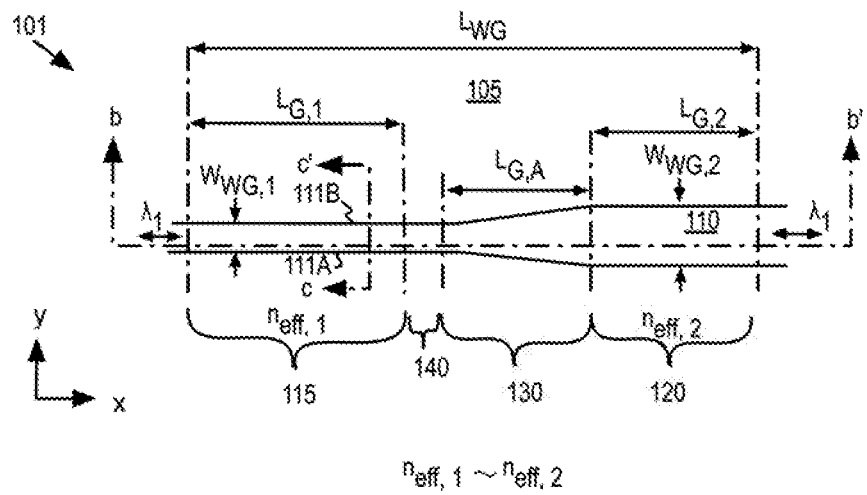
FIG. 1A is a plan view of a monolithic asymmetric optical waveguide grating resonator, in accordance with an embodiment.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings and are not intended to restrict the application of claimed subject matter. Therefore, the following detailed description is not to be taken in a limiting sense and the scope of claimed subject matter is defined solely by the appended claims and their equivalents.

In the following description, numerous details are set forth, however, it will be apparent to one skilled in the art, that embodiments may be practiced without these specific details. In some instances, well-known methods and devices are shown in block diagram form, rather than in detail, to avoid obscuring inventive aspects of the exemplary embodiments. References throughout this specification to "an embodiment" or "one embodiment" mean that a particular feature, structure, function, or characteristic described in connection with the embodiment is included in at least one embodiment. Thus, the appearances of the phrase "in an embodiment" or "in one embodiment" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the first and second embodiments are not mutually exclusive.

As used in the description of the exemplary embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

As described in greater detail below, monolithic asymmetric optical waveguide grating resonators include an asymmetric resonant grating disposed in a waveguide. For asymmetry, gratings are of different strengths. A first grating strength is provided along a first grating length, and a second grating strength, higher than the first grating strength, is provided along a second grating length. In advantageous embodiments, the effective refractive index of the resonant grating along first grating length is substantially matched to the effective refractive index along second grating length through proper design of waveguide and grating parameters. A well-matched effective index of refraction may permit the resonant grating to operate in a highly asymmetric (e.g., 100:1 or even 1000:1 front:back power ratio) single longitudinal mode (SLM). In exemplary embodiments also described in detail below, an asymmetric monolithic DFB laser diode with front and back grating sections having waveguide and grating parameters as described herein may provide highly asymmetric narrowband laser output through primarily the front grating section. In further embodiments also described in detail below, an asymmetric DFB laser with an effective refractive index that is nearly constant may be fabricated using robust SiPh technology that is readily scalable to high volumes as patterning of the gratings does not require low-volume techniques such as e-bean lithography.

In embodiments, a monolithic asymmetric resonant grating includes an optical waveguide disposed on a substrate. A diffraction grating is disposed in the waveguide with a first length of the grating at a first end of a resonant cavity and a second length of the grating at a second end of the resonant cavity. The first grating length has a first grating strength, and the second grating length has a second grating strength, different than the first strength. In advantageous embodiments, the first and second grating strength are different by more than a factor of two, advantageously at least a factor of four, and most advantageously a factor of 10, or more. Noting the effective refractive index of the waveguide is effected by the grating and therefore gratings of differing strength may induce a variation in effective refractive index that could lead to multiple modes of resonance within the cavity, advantageous embodiments employ a grating and optical waveguide architecture that varies over the length of the cavity in a manner that reduces effective refractive index variation over the length of the cavity. In one such embodiment, the effective index of refraction of the grating along a first grating length proximate to a first end of a resonant cavity is approximately equal to the effective refractive index of a second grating along second grating length proximate to a second end of the resonant cavity.

FIG. 1A is a plan view of a monolithic asymmetric optical waveguide grating resonator 101, in accordance with an exemplary embodiment. Waveguide grating resonator 101 includes a waveguide 110 disposed over a substrate 105. Waveguide 110 has opposite sidewalls 111A, 11B extending from the substrate along a longitudinal length of the waveguide $L_{WG}$ and separated by a transverse width of the waveguide $W_{WG}$. Within the waveguide length $L_{WG}$, grating resonator 101 includes a first grating length 115 at a first end of the waveguide length and a second grating length 120 at a second end of the waveguide length. The two grating lengths may be separated by a grating defect 140. Grating defect 140 may function to suppress double degenerate patterns. One such defect is a quarter wave shift (QWS) in the grating. For resonator 101, the waveguide 110 has an effective refractive index that is well-matched between grating length 115 ($n_{eff,1}$) and grating length 120 ($n_{eff,2}$).

Figure 1B:
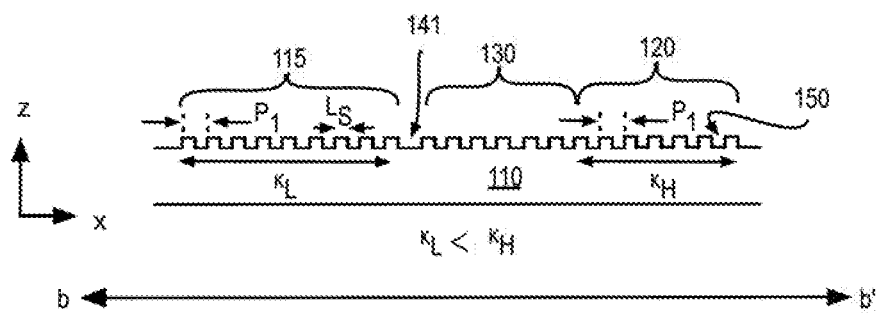
FIG. 1B is a cross-sectional view of the waveguide grating resonator depicted in FIG. 1A along the b-b' line shown in FIG. 1A, in accordance with an embodiment.

FIG. 1B is a cross-sectional view of the waveguide grating resonator 101 along the b-b' line shown in FIG. 1A, in accordance with one embodiment. As shown in FIG. 1B, QWS 141 separates first grating length 115 from second grating length 120. While grating resonator 101 is illustrated with surface (top-side) corrugation, any diffraction grating architecture may be utilized (e.g., sidewall corrugation, etc.). Regardless of the structural element establishing the grating, the grating strength ($\kappa$) along first grating length 115 is different than the grating strength along the second grating length 120. For example, in the illustrated embodiment a grating in waveguide 110 has a lower grating strength ($\kappa_L$) along first grating length 115 than along second grating length 120, where strength is higher ($\kappa_H$).

In embodiments, a monolithic asymmetric resonant waveguide grating with varying grating strength has a first series of corrugation structures along the first grating length and a second series of corrugation structures along the second grating length. In further embodiments, both the first and second series of corrugation structures have the same constant period and duty cycle. Thus, aside from the grating defect, the resonant grating may have a fixed period and duty cycle. For such embodiments, spatial modulation of the grating is independent of grating period and duty cycle, which enables robust and manufacture because patterning requirements may be relaxed. Corrugation structures may take a wide variety of geometries, but are generally regions of a different material embedded below, or extending from, the surface planes defined by the waveguide material in regions between adjacent corrugation structures. Referring to the example of FIG. 1B, corrugation structures 150 are regions of a second material within both grating length 115 and grating length 120. Corrugation structures 150 advantageously have the same grating period $P_1$. Likewise, corrugation structure 150 has a constant length $L_s$ rendering the duty cycle constant across the length of the waveguide resonator $L_{WG}$ except for QWS 141.

In embodiments, effective refractive index is matched between gratings of differing strength, at least in part through spatial modulation of the waveguide width. Referring again to FIG. 1A, waveguide 110 has a first transverse width $W_{WG,1}$ along first grating length 115. In the exemplary embodiment illustrated, waveguide width $W_{G,1}$ is constant over the length of waveguide $L_{WG,1}$ along which first grating length 115 extends. Waveguide 110 has a second transverse width $W_{WG,2}$ along second grating length 120. In the exemplary embodiment illustrated, waveguide width $W_{WG,2}$ is constant over the length of waveguide $L_{WG,2}$ along which second grating length 115 extends. For this exemplary embodiment where grating strength is lowest along first grating length 115, first waveguide width $W_{G,1}$ is smaller than second waveguide width $W_{WG,2}$. The difference between waveguide widths $W_{WG,1}$ and $W_{WG,2}$ may vary considerably, for example as a function of the waveguide medium, target wavelength, and magnitude of asymmetry in grating strengths between grating lengths 115 and 120. In exemplary embodiments, waveguide widths $W_{WG,2}$ may be up to a factor of 3, or more, larger than waveguide width $W_{WG,1}$.

In embodiments, a monolithic asymmetric resonant waveguide grating with varying waveguide width and grating strength further includes an apodized grating length between the grating lengths disposed at opposite ends of the resonant cavity. One or more waveguide and grating parameters may be modulated over the apodized grating length to modulate a photon density distribution within the resonant cavity. In advantageous embodiments, at least one of grating strength and waveguide width are modulated across the apodized grating length. The waveguide width and grating strength may be a linear or non-linear function of position within the waveguide as needed to achieve a desired apodization function (e.g., Gaussian, raised-cosine, etc.). As shown in FIGS. 1A and 1B, apodized grating length 130 is disposed between first grating length 115 and second grating length 120. Within apodized grating length 130, waveguide width varies from waveguide width $W_{G,1}$ to waveguide width $W_{WG,2}$ as a mode-shaping transition between the two ends of resonator 101. For the illustrated embodiment, waveguide width varies linearly with position (i.e., an adiabatic taper). In further embodiments, a grating parameter affecting grating strength may also be varied over the apodized grating length 130 for a multi-parameter apodization function. In advantageous embodiments, grating pitch remains constant across apodized grating length 130 (e.g., grating pitch $P_1$ may be maintained). Grating duty cycle is also advantageously constant within apodized grating length 130.

Figure 1C:
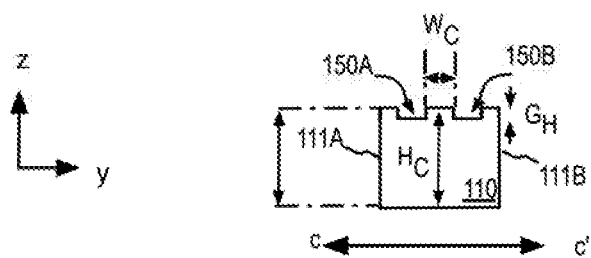
FIG. 1C is a cross-sectional view of the waveguide grating resonator depicted in FIG. 1A along the c-c' line shown in FIG. 1A, in accordance with an embodiment.

In embodiments, at least one series of corrugation structures within an asymmetric waveguide resonant grating further comprises a plurality of corrugation structures within one period of the grating. FIG. 1C is a cross-sectional view of waveguide grating resonator 101 along the c-c' line shown in FIG. 1A, in accordance with an embodiment referred to herein as a "center-less" grating. In a center-less grating architecture, corrugation structures are formed in optical waveguide 110, but the center of waveguide 110 is left without a pattern. A center-less grating perturbs the optical mode through a modulation of the surface of the waveguide, but by splitting the corrugation structure at the center into two laterally opposing surface structures 150A and 150B perturbation of the center of the fundamental mode is avoided. Structures 150A and 150B are separated by a gap comprising the center portion of a (top) surface of waveguide 110. Modulating the center waveguide width $W_C$ over the waveguide length $L_{WG}$ may vary grating strength. Hence, a larger $W_C$ may be utilized within grating length 115 for lower grating strength, while a smaller $W_C$ may be utilized for higher grating strength within second grating length 120. Through modulation of both $W_C$ and waveguide width $W_{WG}$, highly asymmetric SLM operation may be achieved by resonator 101.

As depicted in FIG. 1C, a center-less surface corrugated grating perturbs corners of waveguide 110 with the laterally opposing surface structures have a grating z-height $H_G$ that is less than the z-height of the waveguide sidewalls 111A, 111B. As such, the profile of the pair of corrugation structures 150A, 150B may be defined by an etch profile rather than a lithographically defined tooth, which may lead to more repeatable corrugation. Corrugation structure 150B extends from waveguide sidewall 111A across a first portion of the waveguide width $W_{WG}$, toward the opposite sidewall 111B. Corrugation structure 150B extends from sidewall 111B across a second portion of the waveguide width $W_{WG}$, toward sidewall 111A. As described further elsewhere herein, a center-less grating may have a width smaller than the waveguide width such that corrugation structures 150A, 150B do not extend through a top portion of the waveguide sidewalls. However, where waveguide width is reduced along one grating length (e.g., grating length 115), grating width is likely greater than waveguide width. Corrugation structures 150A, 150B would then extend through a top portion of the waveguide sidewalls.

A center-less grating may also achieve a lower grating strength than can be achieved with conventional surface corrugated grating designs, such as a single opening/period architecture. Gratings with a single opening/period often need exceedingly high resolution to provide sufficient variation in grating strength, for example requiring e-beam lithography or holographic techniques. Gratings with a single opening/period often also require exceedingly shallow corrugation z-heights, often below 10 nm z-heights.

Figure 2A:
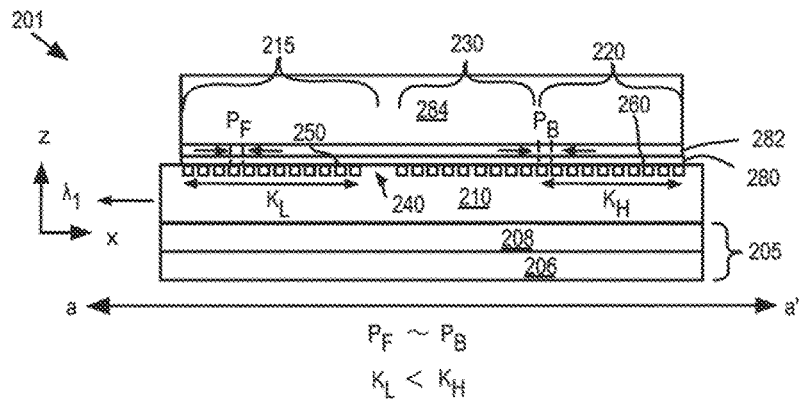
FIG. 2A is a cross-sectional view of a monolithic asymmetric hybrid silicon DFB laser diode, in accordance with an embodiment.

Waveguide grating resonator 101 may be incorporated in a number of optical devices, such as, but not limited to, optical filters employing a plurality of coupled resonators, and laser diodes employing one such resonator. For a DFB laser diode, waveguide grating resonator 101 may be incorporated with a gain medium. The matched refractive index and high grating asymmetry may enable a highly asymmetric laser output. While waveguide grating resonator 101 may be fabricated directly in a gain medium, such as an InGaAs waveguide, etc., FIG. 2A is a cross-sectional view of a monolithic asymmetric hybrid silicon DFB laser diode 201, in accordance with an advantageous SiPh embodiment.

A hybrid silicon DFB laser diode includes a resonant waveguide grating in a silicon-based semiconductor evanescently coupled to a III-V semiconductor optical gain medium. For the exemplary embodiment in FIG. 2, hybrid silicon DFB laser diode includes an optical waveguide 210 patterned in a silicon semiconductor device layer of a substrate 205. Substrate 205, may be any substrate known in the art to be suitable for forming an IC, such as, but not limited to, a semiconductor substrate, a semiconductor-on-insulator (SOI) substrate, an insulator substrate (e.g., sapphire), or the like, and/or combinations thereof. In advantageous embodiments, optical waveguide 210 is a crystalline (e.g., substantially monocrystalline) semiconductor layer, such as silicon. Alternative semiconductors, such as germanium or SiGe are also possible. Optical waveguide 210 is disposed on a substrate material 208 having sufficiently high index contrast with the waveguide material. In the exemplary embodiment where optical waveguide 210 is silicon and substrate 205 is a silicon SOI substrate having a base substrate material 206 of silicon, material 208 is silica.

A III-V gain medium is bonded or epitaxially grown adjacent to waveguide 210. In the exemplary embodiment in FIG. 2A, a III-V material stack is bonded to or epitaxially grown over a top surface of waveguide 210, spanning a front diffraction grating section 215 and a back diffraction grating section 220 to provide a gain medium-semiconductor material interface extending along waveguide 210 parallel to the direction of propagation of a resonant longitudinal optical mode. Depending on the dimensions of waveguide 210, a part of the resonant optical mode is inside the III-V gain medium material stack. The gain medium material stack may be electrically pumped through a diodic structure to generate light in the resonant cavity defined by from and back grating sections 215, 220. In embodiments, the gain medium material stack includes a III-V semiconductor material layer 280, such as InP having a first conductivity type (e.g., n-type). In one particular embodiment, a multiple quantum well (MQW) functions as the gain medium and may include a thin stack of a variety of materials, such as, but not limited to AlGaInAs, InGaAs, and/or InP/InGaAsP, and/or the like. The diodic structure is completed with a III-V semiconductor material layer 284 having a conductivity type complementary to that of layer 280 (e.g., p-type).

Lasing may be achieved within waveguide 210 where the gain medium material includes an active III-V material stack evanescently coupled to the silicon waveguide with waveguide gratings establishing a resonant optical cavity. In the illustrated example, back grating section 220 has a higher grating strength ($\kappa_H$) than does front grating section 215 such that an optical beam of the resonant wavelength $\lambda_1$ is output asymmetrically; predominantly from the "front" side of laser 201. In advantageous embodiments, grating strengths between the front and back grating sections differ by more than a factor of two, advantageously by at least a factor of four, and more advantageously by a factor of 10, or more. Such differences in grating strength more provide an symmetry in laser output power of 1000:1, or more. Extending from front grating section 215, waveguide 210 may continue, coupling output from laser 201 to other components in a PIC for example. The reflective power of grating sections 215 and 220 may be tuned based on either or both of grating length and grating strength. In embodiments, both front grating section 215 and back grating section 220 comprise a series of surface corrugation structures (250, 260, respectively) having a same z-height (i.e., depth). Each surface corrugation structure 250, 260 comprises a different material than that of waveguide 210, and in the exemplary embodiment each surface corrugation structure 250, 260 is a region of silica. In the exemplary embodiment illustrated, the first and second series of corrugation structures 250, 260 have the same constant period (i.e., $P_f = P_b$) and the same duty cycle. Exemplary embodiments where the grating is a silicon/silica system and the laser wavelength is centered at 1310 nm, $P_f$ ($P_b$) may be approximately 200 nm. For embodiments where grating pitch and depth is held constant, different grating strengths may be achieved through a spatial modulation between surface corrugation structures 250 and surface corrugation structures 260.

Figure 2B:
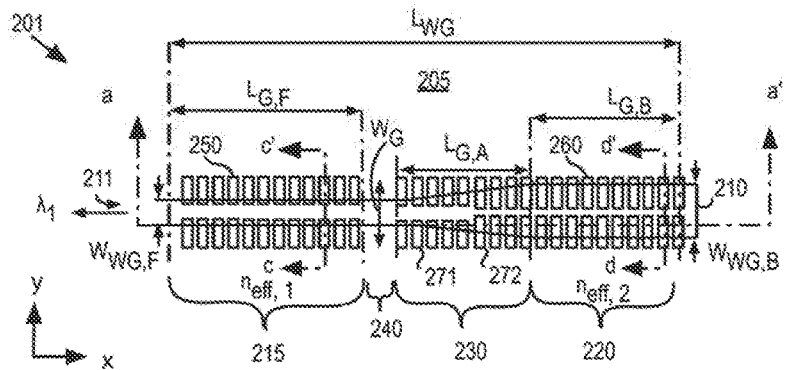
FIG. 2B is a plan view of the DFB laser depicted in FIG. 2A, in accordance with an embodiment.

FIG. 2B is a plan view of monolithic asymmetric hybrid silicon DFB laser diode 201, in accordance with an embodiment. The a-a' line illustrated in FIG. 2A is denoted in FIG. 2B for reference. Optical waveguide 210 has opposite sidewalls extending from substrate 205 along a longitudinal length and separated by a first transverse width $W_{WG,F}$ along a front grating length $L_{G,F}$ where front diffraction grating section 215 is located. Waveguide 210 has a wider width $W_{WG,B}$ along a back grating length $L_{G,B}$ where back diffraction grating section 220 is located. Waveguide 210 may be a rib waveguide, strip waveguide, or the like. The front waveguide width $W_{WG,F}$ may be designed narrower than the back waveguide width $W_{WG,B}$ to sufficiently counter any effective index of refraction difference resulting from spatial modulation between surface corrugation structures 250 and 260. Therefore, a desired narrowband resonance needed for lasing may be maintained. In certain embodiments where waveguide 210 is silicon and a 1310 nm wavelength is of interest, waveguide widths $W_{WG,F}$ and $W_{WG,B}$ may each vary between approximately 0.4 µm and 1.1 µm to match the effective refractive index of front grating section 215 ($n_{eff,f}$) with the effective refractive index of back grating section 220 ($n_{eff,b}$).

In embodiments, a laser diode further includes an apodized grating section between front and back grating sections. The apodized section may flatten the photon density inside the laser cavity. A flatter photon density profile along the length of the laser advantageously reduces the SHB effect. FIGS. 3 and 4 are graphs of photon density as a function of position within an asymmetric DFB laser diode, with and without apodized grating sections in accordance with embodiments. In FIGS. 3 and 4, the reference (zero) position is at the beam exit point (outermost corrugation structure in from grating). FIG. 3 indicates how strongly normalized photon density peaks within the resonant cavity for embodiments having asymmetric grating strength, but lacking grating apodization. As shown in FIG. 4 however, with a properly apodized grating, normalized photon density is flat throughout the cavity up to the position where density rapidly falls off within the back grating section.

For laser diodes including a grating defect separating the front and back grating sections, the apodized grating section may be considered part of the back or front grating section, or both, as a function of the position of the apodized grating section relative to the grating defect. In the exemplary embodiment illustrated in FIGS. 2A and 2B, apodized grating section 230 is disposed between grating defect 240 (e.g., QWS) and back grating section 220. Apodized grating section 230 may have any of the properties previously described in the context of apodized grating 130. For example, one or more waveguide and grating parameters may be modulated over the apodized grating section 230 to modulate a photon density distribution within laser 201. In advantageous embodiments, at least one of grating strength and waveguide width are modulated across apodized grating section 201, and in the exemplary embodiment depicted in FIG. 2B, both are modulated. The waveguide width and grating strength may be a linear or non-linear function of position within the waveguide as needed to achieve a desired apodization function (e.g., Gaussian, raised-cosine, etc.). Within apodized grating section 230, waveguide width varies from waveguide width $W_{WG,F}$ to waveguide width $W_{WG,B}$. In further embodiments, a grating parameter affecting grating strength may also be varied over the apodized grating length 130 as a component of a multi-parameter apodization function. For example, for a center-less grating, the width of the center portion of the waveguide between a pair of laterally opposing corrugation structures is varied within apodized grating section 230. In one such embodiment, a center width of the front grating section 215 is employed at a first end of apodized grating section 230 proximate to front grating section 215 and decreases to a center width of back grating section 220 at second end proximate to back grating section 220.

In embodiments where apodization extends into a front grating of an asymmetric laser diode, waveguide width may vary as a function of position within the front grating section. In other embodiments, where a front grating section is center-less, a width of the center waveguide portion may vary as a function of position within the front grating section. In other embodiments, both waveguide width and center waveguide width varies as a function of position within the front grating section. FIG. 5A is a plan view of an asymmetric DFB laser diode 501 with an apodized front grating 515. Waveguide width $W_{WG,F}$ varies over at least a portion of front grating length $L_{G,F}$, and center width $W_C$ is constant, in accordance with an embodiment. The waveguide width may vary linearly or non-linearly with waveguide position. The magnitude of variation in waveguide width $W_{WG,F}$ is expected to be less than the difference between front and back waveguide widths $W_{WG,F}$ and $W_{WG,B}$. FIG. 5B is a plan view of an asymmetric DFB laser diode 502 with an apodized front grating 515. In this embodiment, waveguide width $W_{WG,F}$ is constant and a center-less grating center width $W_C$ varies over at least a portion of front grating length $L_{G,F}$. The waveguide center width may vary linearly or non-linearly with waveguide position. The magnitude of variation in center width $W_C$ is expected to be less than the difference in center width between front and back waveguide sections.

In embodiments, at least a front grating of an asymmetric DFB laser diode includes a pair of corrugation structures within one period of the grating formed in the resonant waveguide. In other words, at least the front grating has a center-less architecture. With a strength of the grating being a function of a spacing between the pair of corrugation structures, the lower grating strength of the front grating section may be achieved through adequate spacing between the pair of corrugation structures. Depending on the magnitude of difference in grating strength desired between the front and back grating section, a back grating section may also be center-less with a pair of corrugation structures within one period of the grating, albeit with smaller spacing between the pair than for the front grating section. Alternatively, the back grating section may have only one corrugation structure extending across the entire waveguide width, or only a portion thereof (e.g., a centered surface corrugation structure).

Figures 2C, 2D, 2E:
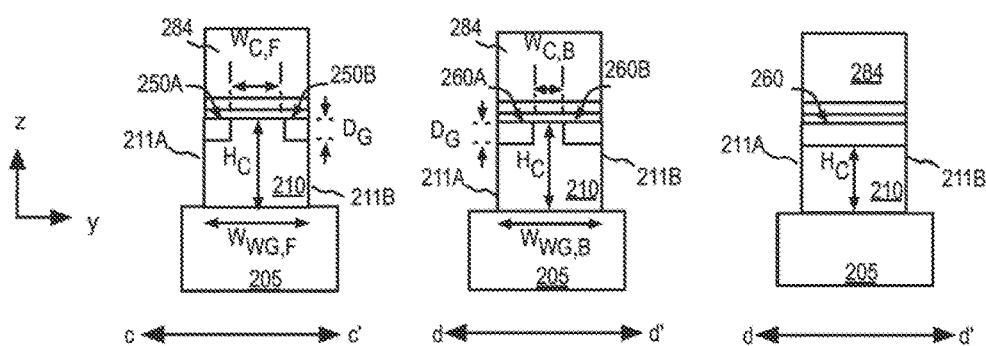
FIG. 2C is a cross-sectional view of the DFB laser depicted in FIG. 2B along the c-c' line shown in FIG. 2B, in accordance with an embodiment.
FIG. 2D is a cross-sectional view of the DFB laser depicted in FIG. 2B along the d-d' line shown in FIG. 2A, in accordance with an embodiment.
FIG. 2E is a cross-sectional view of the DFB laser depicted in FIG. 2B along the d-d' line shown in FIG. 2A, in accordance with an alternative embodiment.

FIG. 2C is a cross-sectional view of the DFB laser 201 along the c-c' line shown in FIG. 2B, in accordance with an embodiment. FIG. 2D is a cross-sectional view of the DFB 201 along the d-d' line shown in FIG. 2B, in accordance with a further embodiment. As shown in FIG. 2C, corrugation structure pair 250A and 250B are laterally separated by center waveguide portion of width $W_{C,F}$ within front grating section 215. As shown in FIG. 2D, within second grating section 220, corrugation structure pair 260A and 260B are laterally separated by center waveguide portion of width $W_{C,B}$. Corrugation structures 250A,B and 260A,B all have a same grating depth $D_G$ that is some amount less than height of sidewalls 211A, 211B. More specifically for an exemplary 1310 nm bandwidth laser with a silicon/silica grating system $D_G$ may vary between 10 nm and 50 nm, for example. Grating strength variation is then a function of the difference between center width $W_{C,F}$ and $W_{C,B}$. For lower grating strength, $W_{C,F}$ is made larger than $W_{C,B}$. Depending on the front and back waveguide widths $W_{WG,F}$ and $W_{WG,B}$, the center widths $W_{C,F}$ and $W_{C,B}$ may range between 0 µm and 1 µm. Back grating section 220 for example may have only a single surface corrugation feature 260 for each grating period, as shown in FIG. 2E. Such an alternative embodiment is one example of a device employing both a center grating (narrower or as wide as the waveguide) and a center-less grating. Waveguide width $W_{WG,F}$ is differentiated from waveguide width $W_{WG,B}$ to counter effective refractive index shift induced by the relatively larger $W_{C,F}$.

Figure 6:
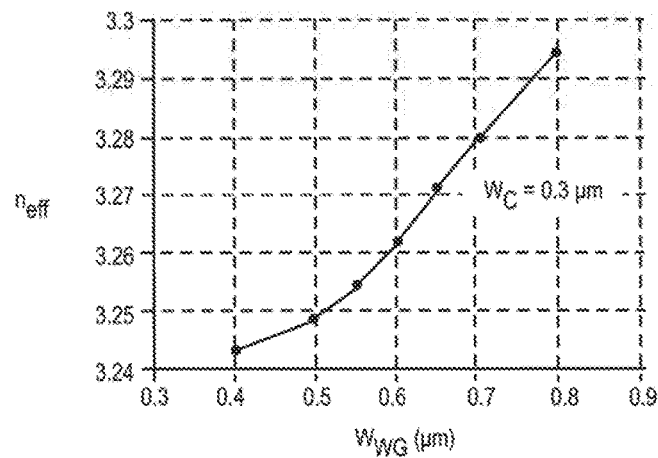
FIG. 6 is a graph illustrating effective index of refraction as a function of waveguide width, in accordance with an exemplary center-less grating embodiment.

FIG. 6 is a graph illustrating effective index of refraction as a function of waveguide width, in accordance with an exemplary center-less grating embodiment where the center waveguide width between a pair of corrugation structures is set to 0.3 µm. The effective index of refraction for a grating section is plotted as a function of waveguide width. As shown, index may be varied between ~3.24 and ~3.3 for the exemplary silicon/silica center-less grating for a waveguide width varied from 0.4 µm to 0.8 µm. This control of refractive index may be applied in design of the asymmetric DFB laser 201, or more generally applied to any optical filter.

Figure 7A:
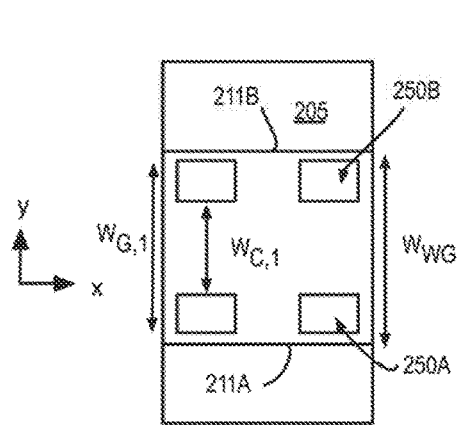
FIGS. 7A, 7B are plan views of a center-less grating in a waveguide, in accordance with embodiments.
Figure 7B:
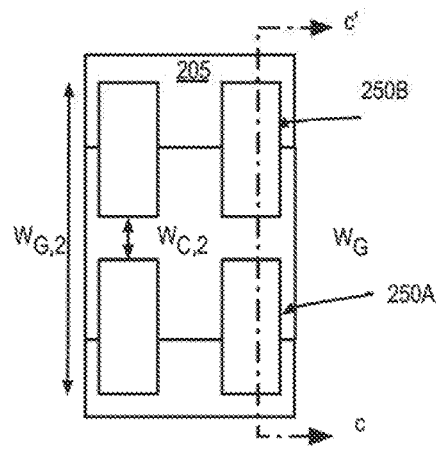
Figure 7C:
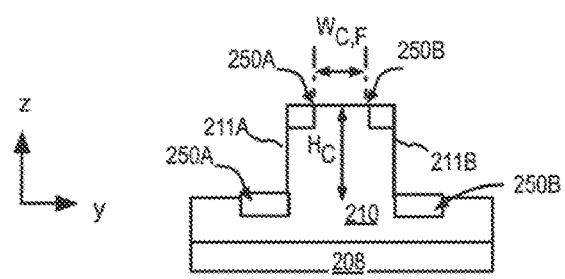
FIG. 7C is a cross-sectional view of a center-less grating along the c-c' line shown in FIG. 7B, in accordance with a ridge waveguide embodiment.

FIGS. 7A and 7B are plan views of a center-less grating in a waveguide, in accordance with embodiments. The center-less grating structures in FIGS. 7A, 7B may be utilized in either of the resonator 101 or laser diode 201, for example. As shown in FIG. 7A, opposite sidewalls 211A, 211B extending from a plane of substrate 205 define a waveguide width $W_{WG}$. In the embodiment illustrated in FIG. 7A, laterally opposing corrugation structures 250A, 250B have inner edges spaced apart by a center waveguide width $W_{C,1}$ having a center height $H_C$. Outer edges of corrugation structures 250A, 250B define a grating width $W_{G,1}$ that is less than waveguide width $W_{WG}$. In the embodiment illustrated in FIG. 7B, laterally opposing corrugation structures 250A, 250B have inner edges spaced apart by a center waveguide width $W_{C,2}$. Outer edges of corrugation structures 250A, 250B define a grating width $W_{G,2}$ larger than waveguide width $W_{WG}$. The inner and outer edge positions illustrated in FIGS. 7A and 7B may be crossed in a third embodiment. FIG. 7C is a cross-sectional view of a center-less grating along the c-c' line shown in FIG. 7B, in accordance with a ridge waveguide embodiment where grating width is larger than waveguide width. As illustrated in FIG. 7C, corrugation structures 250A and 250B extend through a portion of waveguide sidewalls 211A and 211B. A portion of corrugation structures 250A, 250B may also be disposed at the base of sidewalls 211A and 211B. Larger grating width permits larger corrugation structures for relaxed patterning requirements where center width $W_C$ is small. Overlay between a grating mask and waveguide mask may then be utilized to set grating strength in conjunction with the center width $W_C$.

Figure 8:
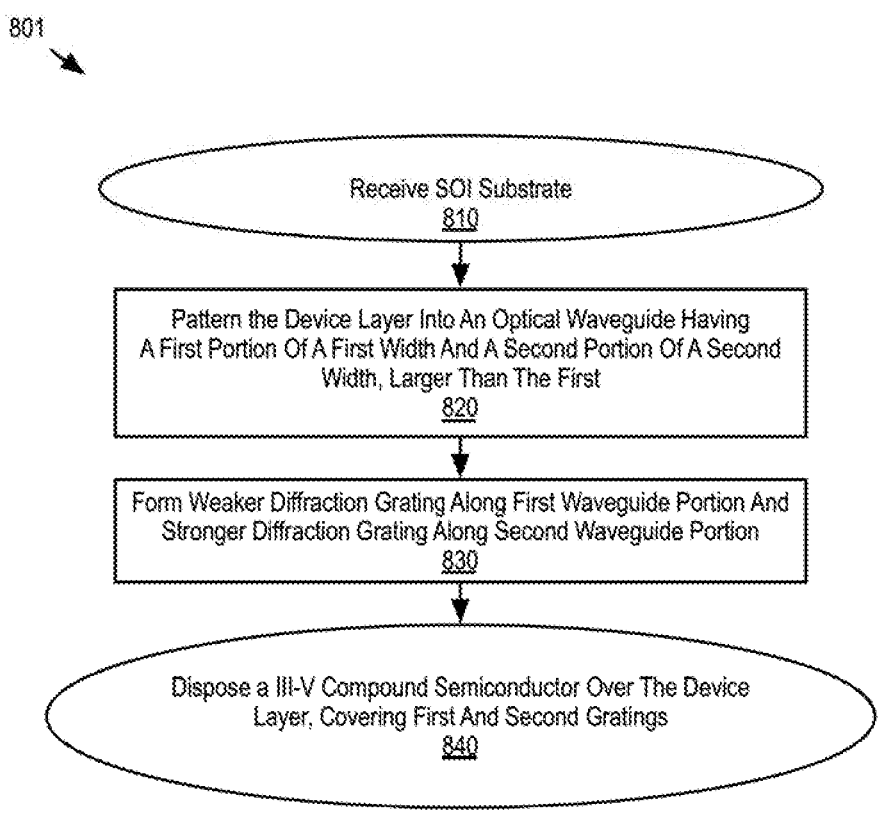
FIG. 8 is a flow diagram illustrating a method of fabricating a hybrid silicon asymmetric DFB laser diode, in accordance with an embodiment.

FIG. 8 is a flow diagram illustrating a method of fabricating a hybrid silicon asymmetric DFB laser diode, in accordance with an embodiment. Method 801 may be performed to form features described above in the exemplary hybrid silicon asymmetric DFB laser diode 201. Method 802 begins with receiving a SOI substrate, such as a silicon SOI substrate, at operation 801. At operation 820 a semiconductor device layer is patterned into an optical waveguide having a first portion of with a first width and a second portion with a second width larger than the first. In exemplary embodiment, the first and second waveguide portions sum to between 50 μm-1 mm in length and each portion is between 0.4 and 1.5 μm in width.

At operation 830, a weaker diffraction grating is formed along the first waveguide portion and a stronger diffraction grating is formed along the second waveguide portion. In one exemplary embodiment, forming at least one of the first and second gratings further comprises etching a pair of openings into the device layer within each period of the grating. A center region of the waveguide separates the pair of openings and each opening has a depth that is less than the height of the waveguide sidewalls. In further embodiments, the center region of the waveguide is between 0.4 and 1.1 μm. Patterning of the grating may be performed before of after patterning of the waveguide as a separate masked etch since both operations entail etching the same device semiconductor layer. In the exemplary embodiment where the grating is a surface grating, the depth of the grating etch is different than the depth of the waveguide etch and operations 820 and 830 are therefore not concurrent. Openings etched at operation 830 may then be filled with a material, such as silica. At operation 840 a group III-V compound semiconductor is disposed adjacent to and extending between the diffraction gratings formed at operation 830. In one exemplary embodiment, a III-V compound semiconductor chip is bonded directly to the substrate received at operation 810, with a MQS structure disposed over the waveguide formed at operation 820.

Figure 9:
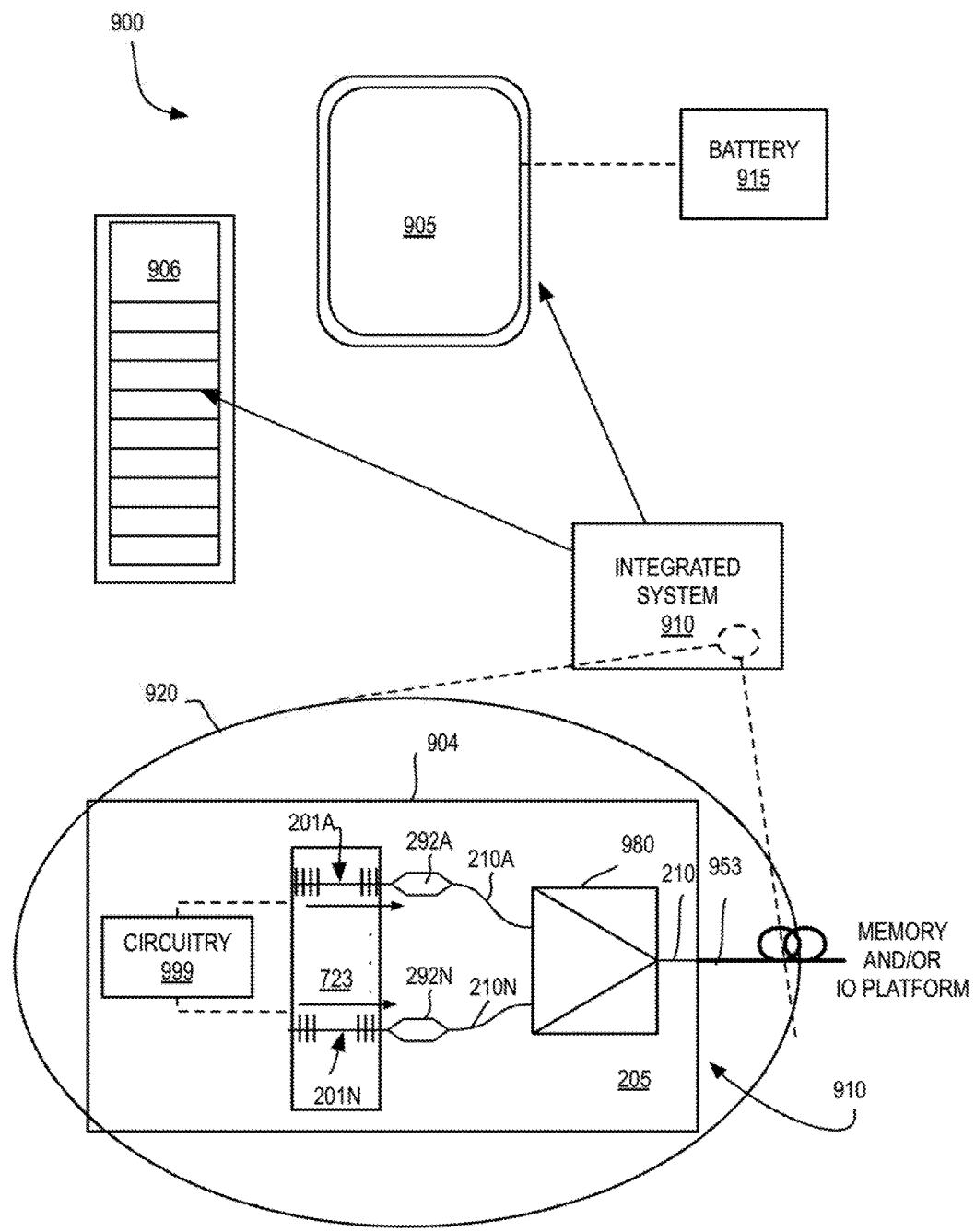
FIG. 9 illustrates a mobile computing platform and a data server machine employing an optical transmitter or transceiver module including a PIC having an asymmetric DFB laser diode, in accordance with an embodiment.

FIG. 9 illustrates a mobile computing platform and a data server machine employing an optical transmitter or transceiver module including a PIC having a monolithic asymmetric DFB laser diode, in accordance with embodiments. Server machine 906 may be any commercial server, for example including any number of high performance computing platforms disposed within a rack and networked together for electronic data processing, which in the exemplary embodiment includes integrated system 910. Mobile computing platform 905 may be any portable device configured for each of electronic data display, electronic data processing, wireless electronic data transmission, or the like. For example, mobile computing platform 905 may be any of a tablet, a smart phone, laptop computer, etc., and may include a display screen (e.g., a capacitive, inductive, resistive, touchscreen), a chip-level or package-level integrated system 910, and a battery 915.

Whether disposed within integrated system 910, further illustrated in expanded view 920, or as a stand-alone packaged chip, packaged monolithic PIC 904 includes a monolithic asymmetric DFB laser diode in accordance with embodiments. In further embodiments, a monolithic asymmetric DFB laser diode is optically coupled with at least one of an optical modulator and WDM. Optical wire 953 outputs a single optical beam from a monolithically integrated optical waveguide 210, for example by top-side coupling or edge coupling. Selected wavelengths are combined with optical multiplexer 980 to couple outputs from a plurality of input optical waveguides 210A-210N also disposed on substrate 205. Input optical waveguides 905A-905N are each further coupled into output ends of DFB laser diodes 201A, 201N, each of which includes an asymmetric diffraction grating structure, for example. Asymmetric DFB laser diodes 201A-201N are in turn electrically coupled to downstream integrated circuitry 999, which may for example further include a pumping voltage supply and sense circuitry, etc. In certain embodiments, voltage supply and sense circuitry is implemented with CMOS transistors also disposed on substrate 105.

Figure 10:
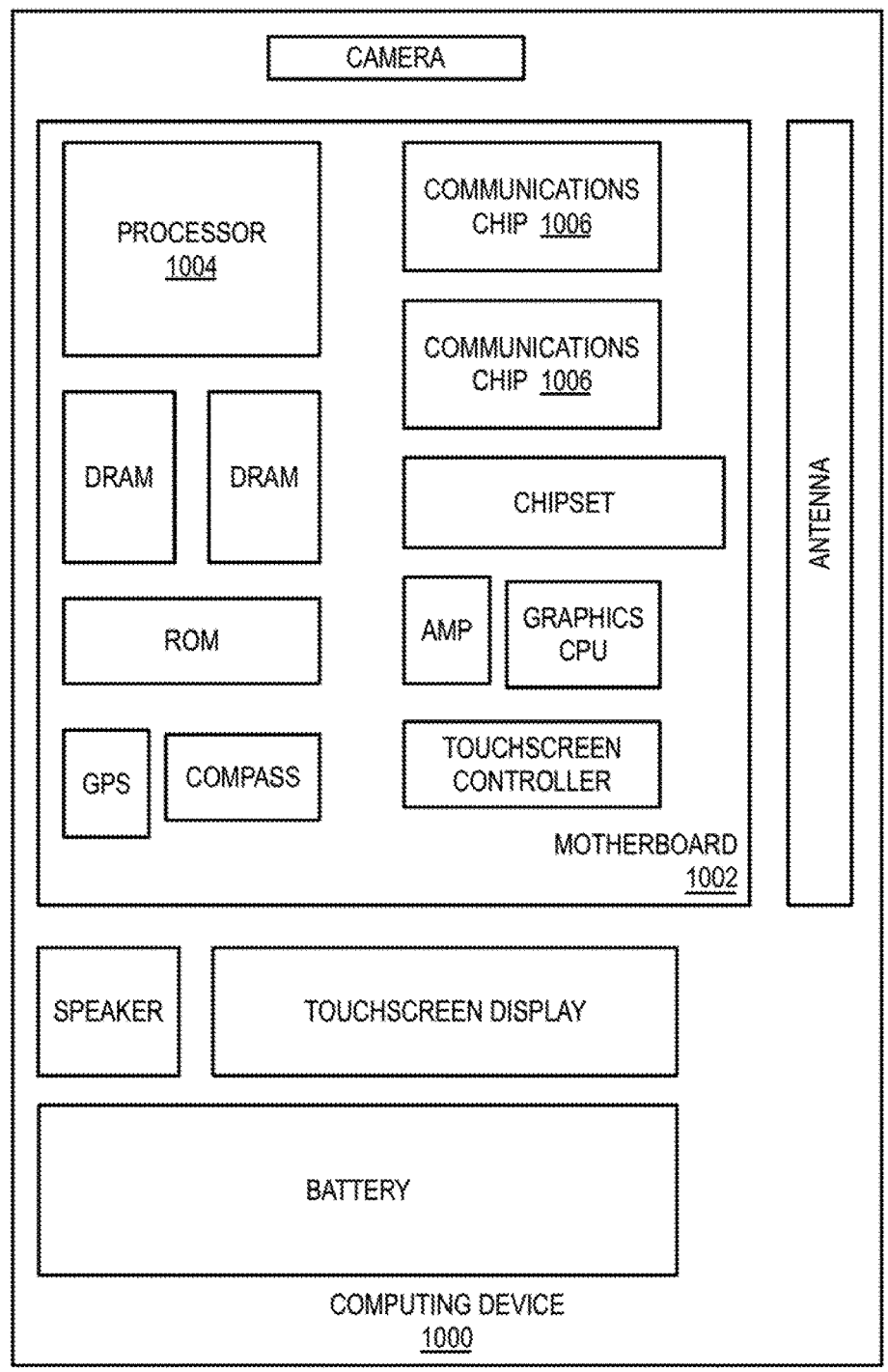
FIG. 10 is a functional block diagram of an electronic computing device, in accordance with an embodiment.

FIG. 10 is a functional block diagram of a computing device 1000, arranged in accordance with at least some implementations of the present disclosure. Computing device 1000 may be found inside platform 1005 or server machine 1006, for example, and further includes a motherboard 1002 hosting a number of components, such as but not limited to a processor 1004 (e.g., an applications processor), and at least one communication chip 1006 which may incorporate one or more asymmetric DBR laser in accordance with embodiments described herein. Processor 1004 may be physically and/or electrically coupled to motherboard 1002. In some examples, processor 1004 includes an integrated circuit die packaged within the processor 1004. In general, the term "processor" or "microprocessor" may refer to any device or portion of a device that processes electronic data from registers and/or memory to transform that electronic data into other electronic data that may be stored in registers and/or memory.

In various examples, one or more communication chips 1006 may also be physically and/or electrically coupled to the motherboard 1002. In further implementations, communication chips 1006 may be part of processor 1004. Depending on its applications, computing device 1000 may include other components that may or may not be physically and electrically coupled to motherboard 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth), or the like.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1006 may implement any of a number of wireless standards or protocols, including but not limited to those described elsewhere herein. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to particular exemplary embodiments.

In one or more first embodiments, a monolithic asymmetric laser diode includes an optical waveguide with opposite sidewalls extending from a substrate along a longitudinal length of the waveguide and separated by a transverse width of the waveguide. A front diffraction grating section is disposed in the waveguide along a front grating length. A back diffraction grating section is disposed in the waveguide along a back grating length. The strength of the back grating section is greater than the strength of the front grating section, and the waveguide along the front grating length has a first width that is smaller than a second width along the back grating length.

In furtherance of the one or more first embodiments, the laser diode further includes an apodized grating section between the front and back grating sections. The waveguide width within the apodized grating section varies from the first width to the second width, and the amount by which the first width is smaller than the second width is sufficient to match the effective refractive index of the waveguide between the front grating and back grating.

In furtherance of the one or more first embodiments, the laser diode further includes an apodized grating section between the front grating section and the back grating section. The waveguide width within the apodized grating section varies from the first width to the second width. The front and back grating sections are separated by a grating defect. The front grating section comprises a first series of corrugation structures along the front grating length. The back grating section comprises a second series of corrugation structures along the back grating length. The first and second series of corrugation structures have the same constant period and duty cycle.

In furtherance of the one or more first embodiments, the first grating includes a first series of corrugation structures along the first grating length. The second grating includes a second series of corrugation structures along the second grating length. At least the first series of corrugation structures further comprises a pair of corrugation structures within one period of the grating, and the strength of the grating is a function of a spacing between the pair of corrugation structures.

In furtherance of the one or more first embodiments, the first grating includes a first series of corrugation structures along the first grating length. The second grating comprises a second series of corrugation structures along the second grating length. Both the first and second series of corrugation structures have the same constant period and duty cycle. At least the front grating section further comprises a pair of corrugation structures within one period of the grating. Each pair of corrugation structures includes laterally opposing surface structures separated by a center portion of the waveguide. The laterally opposing surface structures have a grating depth that is less than the height of the waveguide sidewalls.

In furtherance of the one or more first embodiments, the waveguide is a hybrid waveguide comprising silicon and a III-V semiconductor. The front and back grating sections are within an evanescent region of the hybrid waveguide. The front grating section is phase shifted from the back grating section by a ¼ wavelength function. The front grating section comprises a first series of corrugation structures along the front grating length. The back grating section comprises a second series of corrugation structures along the back grating length. Both the first and second series of corrugation structures have the same constant period and duty cycle. At least the front grating section further includes a pair of corrugation structures within one period of the grating. Each pair of corrugation structures includes laterally opposing surface structures separated by a center portion of the waveguide having the same height as the waveguide sidewalls. The width of the center waveguide portion differs between the front grating section and the back grating section.

In furtherance of the one or more first embodiments, the waveguide is a hybrid waveguide comprising silicon and a III-V semiconductor. The front and back grating sections are within an evanescent region of the hybrid waveguide. The back grating section is phase shifted from the front grating section by a ¼ wavelength function. The front grating section includes a first series of corrugation structures along the front grating length. The second grating section comprises a second series of corrugation structures along the back grating length. Both the first and second series of corrugation structures have the same constant period and duty cycle. At least one of the front and back grating sections further includes a pair of corrugation structures within one period of the grating. Each pair of corrugation structures includes laterally opposing surface structures separated by a center portion of the waveguide having the same height as the waveguide sidewalls. The width of the waveguide, or the width of the center waveguide portion, varies over the front grating length.

In one or more second embodiments a PIC includes the asymmetric laser diode recited in any of the one or more first embodiments. The PIC further includes one or more optical wavelength division multiplexer (WDM), or optical modulator, disposed over the substrate and optically coupled by the waveguide to the laser diode through the front grating.

In one or more third embodiments, an electronic device includes a processor, a memory, and an optical receiver module chip communicatively coupled to at least one of the processor and the memory. The optical receiver module further includes the PIC of the one or more second embodiments.

In one or more fourth embodiments, a method of fabricating a hybrid silicon asymmetric distributed feedback (DFB) laser diode includes receiving a substrate having a silicon semiconductor device layer disposed over a dielectric material layer. The method includes patterning the device layer into an optical waveguide having opposite sidewalls extending from the substrate along a longitudinal length of the waveguide and separated by a transverse width of the waveguide. The optical waveguide includes a first portion of a first width and a second portion of a second width, larger than the first. The method includes forming a first diffraction grating along the first waveguide portion and a second diffraction grating along the second waveguide portion, the second diffraction grating being stronger than the first. The method includes disposing a III-V compound semiconductor adjacent to, and extending between, the first and second gratings.

In furtherance of the one or more fourth embodiments, forming at least one of the first and second gratings further includes etching a pair of openings into the device layer within one period of the grating, the pair of openings separated by a center region of the waveguide and each opening having a same depth that is less than the height of the waveguide sidewalls.

In furtherance of the one or more fourth embodiments, forming at least one of the first and second gratings further includes forming the first grating with a grating strength that is at least a factor of two stronger than the grating strength of the second grating.

In furtherance of the one or more fourth embodiments, forming the first and second gratings further includes etching a series of openings into the device layer over a 50 μm-1 mm length of the waveguide. The series of openings includes pairs of openings within one period of at least the first grating. The pair of openings separated by a center region of the waveguide that is between 0.4 μm and 1.1 μm.

In one or more fifth embodiment, a monolithic asymmetric optical waveguide grating resonator includes an optical waveguide with opposite sidewalls extending from a substrate along a longitudinal length of the waveguide and separated by a transverse width of the waveguide. An asymmetric resonant grating is disposed in the waveguide along the longitudinal length. The grating has a first grating strength along a first grating length, and a second grating strength, higher than the first grating strength, along a second grating length. The effective refractive index of the grating along first grating length is approximately equal to the effective refractive index of the grating along second grating length.

In furtherance of the one or more fifth embodiments, the waveguide along the first grating length has a first width that is smaller than a second width along the second grating length. The asymmetric grating further includes an apodized grating length between the first grating length and the second grating length. The waveguide width varies from the first width to the second width within the apodized grating length.

In furtherance of the one or more fifth embodiments, the waveguide along the first grating length has a first width that is smaller than a second width along the second grating length. The asymmetric grating further includes an apodized grating length between the first grating length and the second grating length. The waveguide width within the apodized grating section varies from the first width to the second width. The asymmetric grating further includes a first series of corrugation structures along the first grating length and a second series of corrugation structures along the second grating length. Both the first and second series of corrugation structures have the same constant period and duty cycle.

In furtherance of the one or more fifth embodiments, the waveguide along the first grating length has a first width that is smaller than a second width along the second grating length. The asymmetric grating further includes an apodized grating length between the first grating length and the second grating length. The waveguide width varies from the first width to the second width within the apodized grating length. The asymmetric grating further includes a first series of corrugation structures along the first grating length and a second series of corrugation structures along the second grating length. At least one of the first and second series of corrugation structures further comprises a plurality of corrugation structures within one period of the grating.

In furtherance of the one or more fifth embodiments, the waveguide is of a first material. The asymmetric grating further includes a first series of corrugation structures along the first grating length and a second series of corrugation structures along the second grating length. The first and second series of corrugation structures includes a second material. At least one of the first series of corrugation structures further comprises a pair of corrugation structures within one period of the grating, each of the pair of corrugation structures further comprising laterally opposing surface structures separated by a center portion of the waveguide. The laterally opposing surface structures have a grating height that is less than the height of the waveguide sidewalls.

In furtherance of the one or more fifth embodiments, the waveguide is of a first material. The asymmetric grating further includes a first series of corrugation structures along the first grating length and a second series of corrugation structures along the second grating length. The first and second series of corrugation structures comprises a second material. At least one of the first and second series of corrugation structures further comprises a pair of corrugation structures within one period of the grating, with each pair of corrugation structures comprising laterally opposing surface structures separated by a center portion of the waveguide. The width of the waveguide, or the width of the center waveguide portion, varies over the waveguide length.

In furtherance of the one or more fifth embodiments, the waveguide is of a first material. The asymmetric grating further includes a first series of corrugation structures along the first grating length and a second series of corrugation structures along the second grating length. The first and second series of corrugation structures comprises a second material. At least one of the first series of corrugation structures further comprises a pair of corrugation structures within one period of the grating, wherein each of the plurality of corrugation structures comprises laterally opposing surface structures separated by a center portion of the waveguide. The laterally opposing surface structures have a grating depth that is less than the height of the waveguide sidewalls. The laterally opposing surface structures include a first structure extending from a first of the opposite waveguide sidewalls across a first portion of the waveguide width. The laterally opposing surface structures also include a second structure in each structure pair extending from a second of the opposite sidewalls across a second portion of the waveguide width.

It will be recognized that embodiments of the invention are not limited to the exemplary embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. Scope should, therefore, be determined with reference to the appended claims, along with the full scope of equivalents to which such claims are entitled.

What is claimed is:

1. A laser diode, comprising:
an optical waveguide having a transverse waveguide width defined by sidewalls extending from a substrate along a longitudinal length of the waveguide;
a front diffraction grating section disposed in the waveguide along a front grating length; and
a back diffraction grating section disposed in the waveguide along a back grating length, wherein at least one of the front and back diffraction grating sections further comprises first corrugation structures and a second corrugation structures, the first corrugation structures laterally separated from the second corrugation structures by a portion of the transverse waveguide width, and wherein:
the front grating section comprises a first series of first corrugation structures having a constant period and duty cycle, and second corrugation structures having the constant period and duty cycle; and
the back grating section comprises a second series of first corrugation structures having the constant period and duty cycle, and second corrugation structures having the constant period and duty cycle.

2. The laser diode of claim 1, wherein the strength of the back grating section is greater than the strength of the front grating section.

3. The laser diode of claim 2, wherein the front grating length is longer than the back grating length.

4. The laser diode of claim 2, wherein the effective refractive index of the waveguide within the front diffraction grating section is approximately equal to the effective refractive index of the waveguide within the back diffraction grating section.

5. The laser diode of claim 1, wherein:
the waveguide comprises a first material;
the first and second corrugation structures comprises a second material embedded within the first material.

6. The laser diode of claim 5, wherein the second material is embedded to a depth of the waveguide that is less than a height of the first material within the waveguide region laterally separating the first and second corrugation structures.

7. The laser diode of claim 5, wherein the second material intersects the waveguide sidewalls.

8. The laser diode of claim 1, wherein the transverse waveguide width, or the width of the center waveguide portion separating the first corrugation structures from the second corrugation structures varies over the front grating length, or varies between the front and back grating lengths.

9. The laser diode of claim 1, wherein:
the waveguide is a hybrid waveguide comprising silicon and a III-V semiconductor;
the front and back grating sections are within an evanescent region of the hybrid waveguide;
the front grating section is phase shifted from the back grating section by a ¼ wavelength function.

10. A photonic integrated circuit (PIC), comprising:
the laser diode of claim 1; and
one or more optical wavelength division multiplexer (WDM), or optical modulator, disposed over the substrate and optically coupled by the waveguide to the laser diode through the front grating.

11. An electronic device, comprising:
a processor;
a memory; and
an optical receiver module chip communicatively coupled to at least one of the processor and the memory, wherein the optical receiver module further comprises:
the PIC of claim 10.

12. A laser diode, comprising:
an optical waveguide having a transverse waveguide width defined by sidewalls extending from a substrate along a longitudinal length of the waveguide;
a front diffraction grating section disposed in the waveguide along a front grating length; and
a back diffraction grating section disposed in the waveguide along a back grating length, wherein at least one of the front and back diffraction grating sections further comprises first corrugation structures and a second corrugation structures, the first corrugation structures laterally separated from the second corrugation structures by a portion of the transverse waveguide width, and wherein the waveguide along the front grating length has a first width that is smaller than a second width along the back grating length.

13. The laser diode of claim 12, further comprising an apodized grating section between
the front and back grating sections, wherein the waveguide width within the apodized grating section varies from the first width to the second width; and
wherein the amount by which the first width is smaller than the second width is sufficient to match the effective refractive index of the waveguide between the front grating and back grating.

14. A monolithic asymmetric optical waveguide grating resonator, comprising:
an optical waveguide with opposite sidewalls extending from a substrate along a longitudinal length of the waveguide and separated by a transverse width of the waveguide; and
an asymmetric resonant grating disposed in the waveguide along the longitudinal length, the grating having a first grating strength along a first grating length, and a second grating strength, higher than the first grating strength, along a second grating length that is shorter than the first grating length;
wherein the effective refractive index of the waveguide within the first diffraction grating length is approximately equal to the effective refractive index of the waveguide within the second diffraction grating length; and
wherein the waveguide along the first grating length has a first width that is smaller than a second width along the second grating length.

15. The waveguide grating resonator of claim 14, wherein at least one of the first and second grating lengths further comprises first corrugation structures and second corrugation structures, the first corrugation structures laterally separated from the second corrugation structures by a portion of the transverse waveguide width.

16. The waveguide grating resonator of claim 14, wherein:
the asymmetric grating further includes an apodized grating length between the first grating length and the second grating length; and
the waveguide width varies from the first width to the second width within the apodized grating length.

17. A method of fabricating a hybrid silicon asymmetric distributed feedback (DFB) laser diode, the method comprising:
receiving a substrate having a silicon semiconductor device layer disposed over a dielectric material layer;
patterning the device layer into an optical waveguide having sidewalls extending from the substrate and defining a transverse waveguide width along a longitudinal length of the waveguide;
forming a first diffraction grating along a first waveguide portion and a second diffraction grating along a second waveguide portion, the second diffraction grating being stronger than the first, the first diffraction grating occupying a longer longitudinal length of the waveguide than the second diffraction grating, and the first and second gratings having a same period and duty cycle; and
disposing a III-V compound semiconductor adjacent to, and extending between, the first and second gratings.

18. The method of claim 17, wherein forming at least one of the first and second gratings further comprises etching a first pair of openings into the device layer, each opening of the first pair of openings separated from the other by a center region of the waveguide.

19. The method of claim 17, wherein etching the first pair of openings into the device layer further comprises etching a set of first openings proximal to a first waveguide sidewall and a set of second openings proximal to a second waveguide sidewall, the first pair of openings including one opening from each of the first and second openings.

* * * * *